United States Patent
Heinz et al.

(10) Patent No.: US 6,448,692 B1
(45) Date of Patent: Sep. 10, 2002

(54) PIEZOELECTRIC ACTUATOR

(75) Inventors: Rudolf Heinz, Renningen; Dieter Kienzler, Leonberg; Friedrich Boecking, Stuttgart, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/520,017

(22) Filed: Mar. 6, 2000

(30) Foreign Application Priority Data

Mar. 4, 1999 (DE) .......................... 199 09 450

(51) Int. Cl.⁷ .............................. H01L 41/04
(52) U.S. Cl. ..................................... 310/328
(58) Field of Search ................. 310/328, 365

(56) References Cited

U.S. PATENT DOCUMENTS

| | | | | |
|---|---|---|---|---|
| 4,720,077 A | | 1/1988 | Minoura et al. | 251/129.06 |
| 5,208,506 A | * | 5/1993 | Yamashita | 310/328 |
| 5,239,223 A | * | 8/1993 | Miyoshi | 310/328 |
| 5,250,868 A | * | 10/1993 | Shirasu | 310/328 |
| 5,272,797 A | * | 12/1993 | Miyoshi | 29/25.35 |
| 5,334,902 A | * | 8/1994 | Inoi | 310/344 |
| 5,477,102 A | * | 12/1995 | Miyoshi | 310/344 |
| 6,172,445 B1 | * | 1/2001 | Heinz et al. | 310/328 |

FOREIGN PATENT DOCUMENTS

| | | | |
|---|---|---|---|
| JP | 07-183586 | * | 7/1995 |
| JP | 08-275563 | * | 10/1996 |
| JP | 10-173247 | * | 6/1998 |
| JP | 11-026829 | * | 1/1999 |
| WO | 98/47188 | * | 10/1998 |

* cited by examiner

*Primary Examiner*—Nestor Ramirez
*Assistant Examiner*—Peter Medley
(74) *Attorney, Agent, or Firm*—Ronald E. Greigg

(57) ABSTRACT

A piezoelectric actuator for actuating control valves or injection valves in motor vehicles. The actuator includes an actuator body in the form of a multilayer laminate of stacked layers of piezoelectric material and intervening metallic or electrically conductive layers acting as electrodes. One bottom plate toward the valve and an opposed top plate are mounted on each of the end faces of the actuator body. The piezoelectric actuator is characterized in that the actuator body on each of its end faces has one piezoelectrically inactive cover layer and that the connection faces of the bottom plate and the top plate which adjoin the end faces of the actuator body have fixation elements that grip the cover layers, for at least nonpositive fixation of the cover layers of the actuator body.

4 Claims, 1 Drawing Sheet

PIEZOELECTRIC ACTUATOR

BACKGROUND OF THE INVENTION

The invention relates to a piezoelectric actuator, especially for actuating control valves or injection valves in motor vehicles. The piezoelectric actuator includes an actuator body in the form of a multilayer laminate of stacked layers of piezoelectric material and intervening metallic or electrically conductive layers acting as electrodes, one bottom plate toward the valve and an opposed top plate being mounted on each of the end faces of the actuator body.

One such piezoelectric actuator is known from German Patent Disclosure DE 196 50 900 A1 of Robert Bosch GmbH. A piezoelectric multilayer actuator of this kind, embodied as a laminated stack of piezoelectric layers with intervening electrode layers, must be installed with mechanical prestressing, because otherwise it would rip apart upon being actuated.

In the aforementioned Patent DE 196 50 900 A1, it is proposed that a piezoelectric multilayer actuator body be glued on its face ends to a bottom plate and a top plate, respectively. The requisite prestressing is brought to bear by spring bands which rest on both sides longitudinally of the actuator body and brace the bottom plate and the top plate together. Since an adhesive layer always has a certain elasticity, the rigidity of the entire system is adversely affected by the adhesive bonds on the face ends of the actuator body. However, since the actuator body must be fixed at the bottom plate and the top plate, fixation techniques that overcome the disadvantage of the lack of rigidity of the overall system are needed.

OBJECT AND SUMMARY OF THE INVENTION

It is an object of the invention to make a piezoelectric actuator possible in such a way that its actuator body can be fixed to the bottom plate and the opposed top plate without adhesive bonds.

In one essential aspect, a piezoelectric actuator according to the invention is distinguished in that the actuator body on each of its end faces has one piezoelectrically inactive cover layer, and that the connection faces of the bottom plate and the top plate which adjoin the end faces of the actuator body have fixation elements that grip the cover layers, for at least nonpositive fixation of the cover layers of the actuator body. The fixation elements that group the piezoelectrically inactive cover layers of the actuator body nonpositively and selectively also positively can, in one exemplary embodiment, be indentations that are each made in the bottom plate and the top plate in such a way that to establish the nonpositive engagement, they are adapted to the outer dimensions of the adjoining end face of the actuator body, or of its piezoelectrically inactive cover layer. Such indentations can advantageously be formed by stamping of the bottom plate and the top plate. Economical stamping of this kind also allows a square or rectangular contour of the indentation, so that advantageously piezoelectric actuators with a rectangular or square outer contour can engage the indentations with positive and nonpositive engagement.

Circular indentations can also be stamped into the bottom plate and the top plate for the fixation of an actuator body of circular outer contour, or if only nonpositive engagement is necessary, an actuator body of square outer contour can be affixed. A circular indentation grips the edges of an actuator body of square cross-section by positive engagement.

In an alternative exemplary embodiment, the fixation elements can each have one fixation ring, whose inside dimension is adapted to the outside dimensions of the adjoining end face or cover layer of the actuator body, and which is fixed at or on the connection face of the bottom plate and of the top plate. If such fixation rings are used, it is advantageous if the cover layers of the actuator body are somewhat thicker.

The fixation rings can also have various inside contours, such as a square or rectangular, or a circular, oval of elliptical inner contour. Fixation rings with a circular inner contour can also be used to fix an actuator body of square outer contour, if it is possible to dispense with a rotary fixation, and fixation rings with an oval or elliptical inner contour can be used to fix actuator bodies of rectangular outer contour, again if a rotary fixation can be dispensed with. In that case, the fixation rings with their inner contour engage the edges of actuator bodies of square or rectangular outer contour by nonpositive engagement.

Since the actual elastic clamping means for prestressing the multilayer actuator are not the subject of this application, they will not be described in further detail here. It will merely be noted that a multilayer actuator of this kind, instead of being prestressed with the spring bands used in the above-cited DE 196 50 900 A1 fastened laterally of the actuator body between the top plate and the bottom plate, can also be prestressed with cup springs or cylindrical helical springs that centrally engage the top plate or bottom plate.

The invention will be better understood and further objects and advantages thereof will become more apparent from the ensuing detailed description of two preferred embodiments taken in conjunction with the drawing.

DESCRIPTION OF THE PREFERRED EMBODIMENTS

Figure 1:
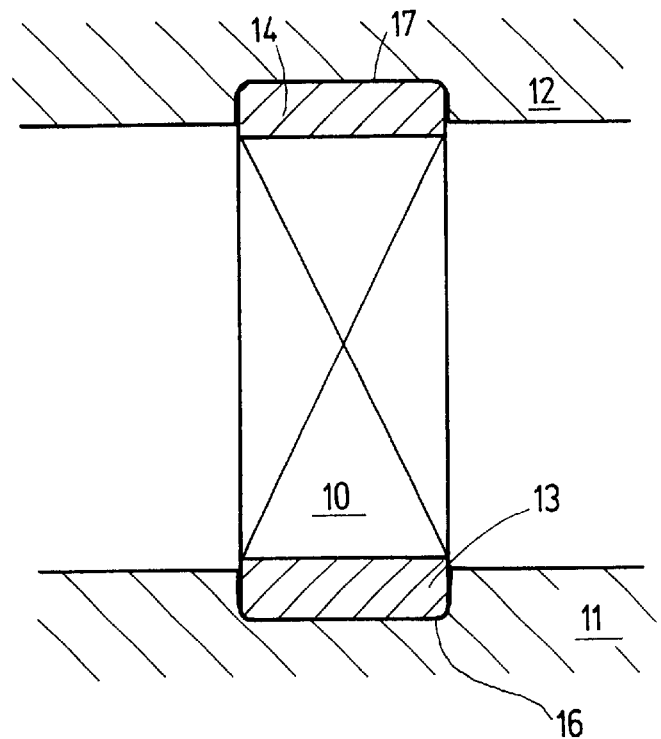
FIG. 1 in a schematic longitudinal section which illustrates a first exemplary embodiment of a piezoelectric actuator according to the invention.

The schematic longitudinal section of FIG. 1 shows a piezoelectric actuator body 10, which comprises a multilayer laminate with stacked layers of piezoelectric material and intervening metal or electrically conductive layers acting as electrodes, and which with its end faces is seated between a bottom plate 11 and an opposed top plate. The face end of the actuator body 10 adjoining the bottom plate 11 and the face end of the actuator body adjoining the top plate 12 are each provided with one piezoelectrically inactive cover layer 13 and 14, respectively. For fixing the actuator body 10 thus formed, the bottom plate 11 and the top plate 12 each have a respective indentation 16 and 17, whose dimensions are each adapted to the other dimensions of the adjoining end face, that is, of the respective piezoelectrically inactive cover layer 13 and 14.

The indentations 16, 17 can advantageously be machined into the bottom plate 11 and the top plate 12, for instance by stamping or erosion. The piezoelectric actuator body 10 engages the aforementioned stamped indentations 16 and 17 at least nonpositively with its end faces, that is, the respective piezoelectrically inactive cover layer 13 and 14. The advantage of the stamped indentations 16 and 17 is that by the stamping process, not only a circular or oval contour but also a square or rectangular contour can be stamped in a simple and economical way. In this way, an actuator body 10 of rectangular or square cross-section, for instance, can be fixed by positive engagement in the indentions 16 and 17.

Thus by means of the indentations 16 and 17, acting as fixation means in the first exemplary embodiment and in which the actuator body 10 can be fixed by positive engagement, the typical adhesive layer in the prior art, which because of its elasticity adversely affected the rigidity of the entire system, can be avoided.

It is understood that an actuator body 10 of square cross-sectional form can also be fixed nonpositively against relative rotation in circular indentations 16 and 17, if care is taken to assure that the inner edge of the indentations 16 and 17 positively engages the edges of the square piezoelectrically inactive cover layers 13 and 14.

Figure 2A:
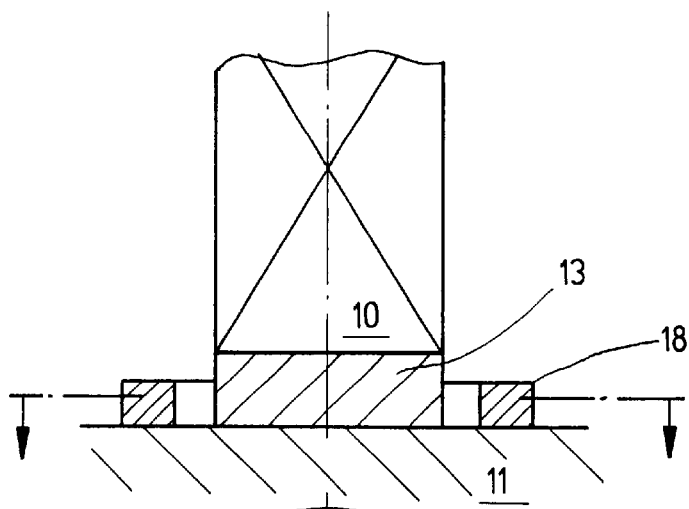
FIGS. 2A and 2B, in the form of a fragmentary longitudinal section and a cross-section, respectively, schematically show a second exemplary embodiment of a piezoelectric actuator according to the invention.
Figure 2B:
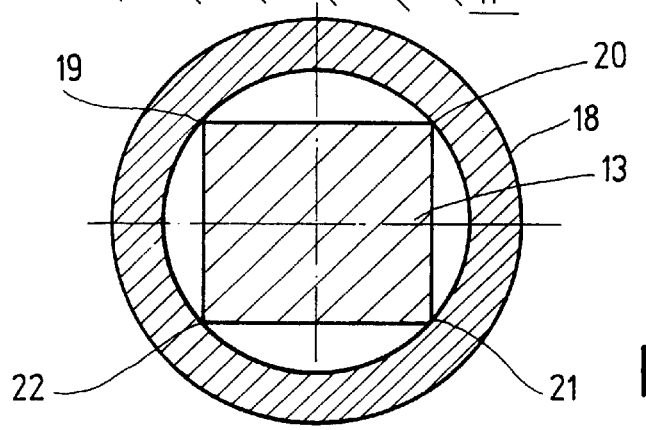

FIGS. 2A and 2B show a second exemplary embodiment of a piezoelectric actuator of the invention; only the portion (the lower portion in FIG. 2A) of the actuator body 10 that adjoins the bottom plate 11 is shown. The piezoelectrically inactive cover layer 13 adjoining the bottom plate is preferably thicker, in the exemplary embodiment shown in FIGS. 2A and 2B, than the piezoelectrically inactive layer 13 of the first exemplary embodiment shown in FIG. 1. In FIGS. 2A and 2B, a fixation ring 18 firmly joined to the bottom plate 11 is used to fix the actuator body 10; its inside dimensions are adapted to the outer dimensions of the adjoining end face of the actuator body 10.

It is understood that the fixation element, which for fixation engages the opposed end face of the actuator body on a piezoelectrically inactive cover layer also provided there, can comprise a fixation ring of the same kind. The fixation ring 18, with its inner annular face, engages the edges of an actuator body 10, for instance of square cross-section, as FIG. 2B shows especially clearly (fixation points 19–22). In a similar way, actuator bodies 10 of rectangular outer contour can be fixed with other fixation rings that have an oval or elliptical inner contour.

The fixation rings 18 used for fixation of the actuator body 10 in FIGS. 2A and 2B perform the same function as the indentations 16 and 17 used in the first exemplary embodiment, in that without an adhesive layer they connect the actuator body 10 to an adjoining bottom plate and top plate. Dispensing with the adhesive layer at the face ends makes for an increase in the rigidity of the overall system.

The foregoing relates to preferred exemplary embodiments of the invention, it being understood that other variants and embodiments thereof are possible within the spirit and scope of the invention, the latter being defined by the appended claims.

We claim:

1. A piezoelectric actuator comprising an actuator body 10 having end faces, said actuator body (10) being in the form of a multilayer laminate of stacked layers of piezoelectric material and intervening metallic or electrically conductive layers which function as electrodes, said actuator including one bottom plate (11) and an opposed top plate (12) being mounted on each of the end faces of the actuator body, the actuator body (10), on each of its end faces, has one piezoelectrically inactive cover layer (13, 14), and that connection faces of the bottom plate (11) and the top plate (12) which adjoin the end faces of the actuator body (10) have fixation elements (16, 17; 18) that grip the cover layers, for at least nonpositive fixation of the cover layers (13, 14) of the actuator body (10), wherein the fixation elements each have one fixation ring (18), adapted in an inside dimension to the outer dimensions of the adjoining cover layer (13, 14) of the actuator body (10), on the connection face of the bottom plate (11) and the top plate (12).

2. The piezoelectric actuator according to claim 1, in which the fixation rings (18) have a square or rectangular inside contour.

3. The piezoelectric actuator according to claim 1, in which the fixation rings (18) have a circular inside contour.

4. The piezoelectric actuator according to claim 1, in which the fixation rings (18) have an oval or elliptical inside contour.

* * * * *